United States Patent
Chen et al.

(10) Patent No.: US 6,316,351 B1
(45) Date of Patent: Nov. 13, 2001

(54) INTER-METAL DIELECTRIC FILM COMPOSITION FOR DUAL DAMASCENE PROCESS

(75) Inventors: Dian-Hau Chen, Hsin-Chu; Ching-Tien Ma, Kaoshiung; Hsiang-Tan Lee, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/583,399

(22) Filed: May 31, 2000

(51) Int. Cl.[7] ............................................. H01L 21/4763
(52) U.S. Cl. ................................. 438/638; 438/687
(58) Field of Search ............................ 438/637, 638, 438/639, 666, 672, 723, 724, 740, 743, 744; 257/758, 751, 752

(56) References Cited

U.S. PATENT DOCUMENTS

| | | | |
|---|---|---|---|
| 5,635,423 | 6/1997 | Huang et al. ..................... 437/195 |
| 5,817,579 | * 10/1998 | Ko et al. ......................... 438/740 |
| 5,969,422 | 10/1999 | Ting et al. ....................... 257/762 |
| 5,985,753 | 11/1999 | Yu et al. .......................... 438/637 |
| 6,010,962 | 1/2000 | Lin et al. ......................... 438/687 |
| 6,013,581 | 1/2000 | Wu et al. ......................... 438/734 |
| 6,037,664 | * 3/2000 | Zhao et al. ....................... 257/758 |
| 6,040,243 | * 3/2000 | Li et al. ........................... 438/687 |
| 6,080,655 | * 6/2000 | Givens et al. ................... 438/626 |

* cited by examiner

Primary Examiner—David Nelms
Assistant Examiner—Dung A Le
(74) Attorney, Agent, or Firm—George O. Saile; Stephen B. Ackerman; Sevgin Oktay

(57) ABSTRACT

The use of an intermetal dielectric (IMD) layer and an organic etch-stop layer are disclosed in forming a dual damascene in order to reduce the RC delay and the overall dielectric constant of the damascene interconnect. The disclosed IMD layer is an FSG and the etch-stop layer is an organic spin-on-glass (SOG). A dual damascene structure utilizing the IMD layer and the organic etch-stop layer is also disclosed.

21 Claims, 3 Drawing Sheets

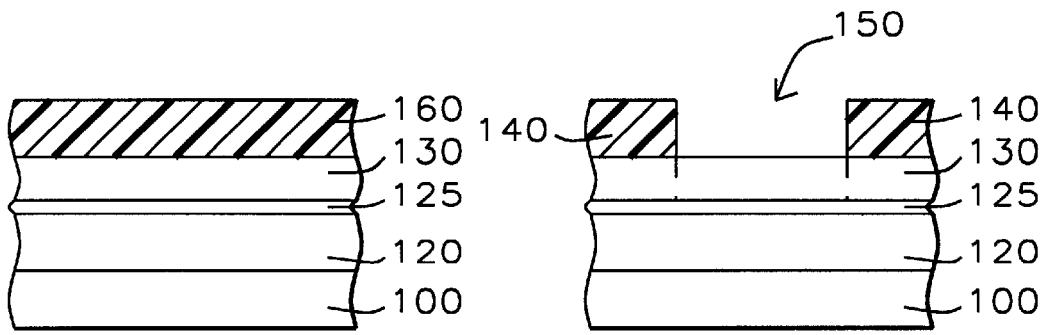
FIG. 1a – Prior Art
FIG. 1b – Prior Art
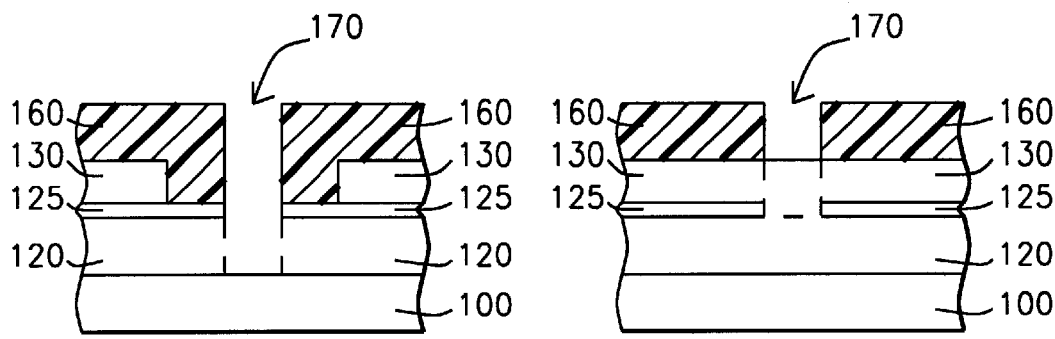
FIG. 1c – Prior Art
FIG. 1d – Prior Art

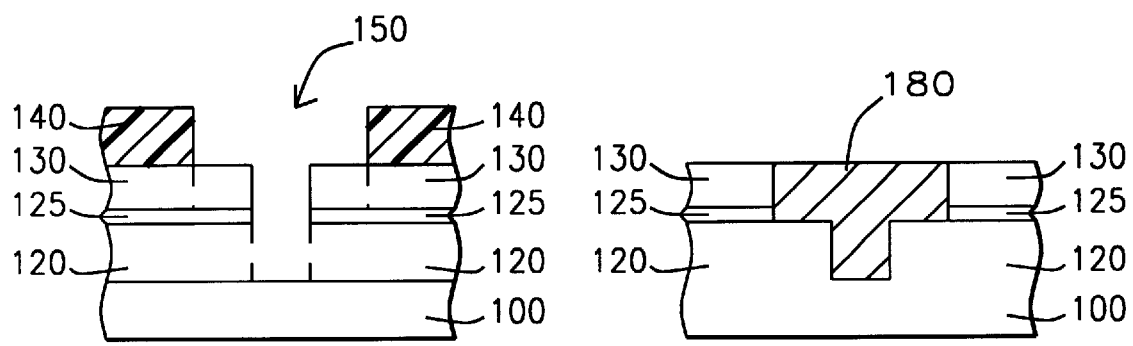
FIG. 1e – Prior Art
FIG. 1f – Prior Art
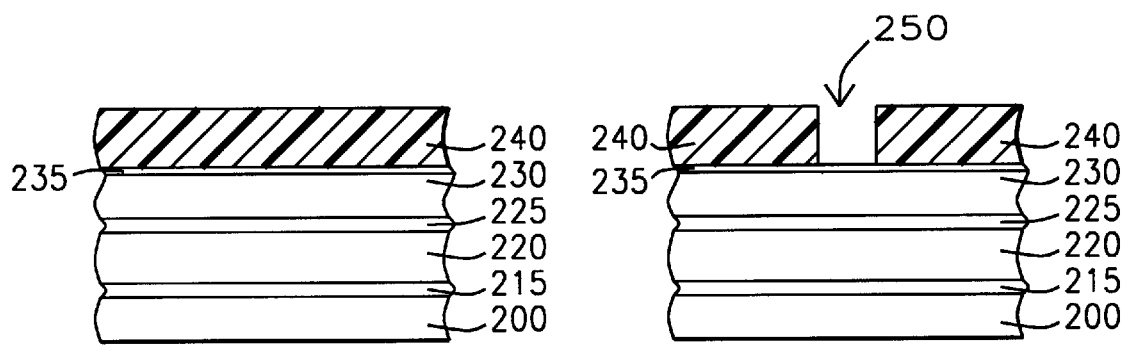
FIG. 2a
FIG. 2b

INTER-METAL DIELECTRIC FILM COMPOSITION FOR DUAL DAMASCENE PROCESS

BACKGROUND OF THE INVENTION

(1) Field of the Invention

The present invention relates to the manufacture of ultra large scale integrated (ULSI) circuit chips in general, and in particular, to a method of using a particular intermetal dielectric (IMD) layer and an etch-stop layer with low-k dielectric constant in order to reduce the RC (resistance capacitance) of a dual damascene interconnect.

(2) Description of the Related Art

As the Very Large Scale Integrated (VLSI) circuit technology has been migrating more and more towards Ultra Large Scale Integrated (ULSI) circuit technology, requirements for interconnecting a myriad of devices has been escalating. Specifically, with the ever increasing miniaturization, the requirements for providing a low RC (resistance capacitance) interconnect pattern has been exacerbated by higher aspect ratio submicron vias, contacts and line trenches. As is known in the art, miniaturization directly affects the RC delay of the parasitic capacitance generated by various insulative layers, including the intermetal dielectric (IMD) layers. Hence, it is disclosed later in the embodiments of the present invention a method of reducing the RC delay by employing different dielectric materials and replacing some of the layers, such as the etch-stop layer used in forming damascene structures, with low dielectric constant (low-k) materials.

Dual damascene process is a well-known technique for forming interconnections in semiconductor devices. It is especially well suited for Ultra Large Scale Integrated (ULSI) circuit technology where more and more devices are being packed into the same or smaller areas in a semiconductor substrate. As the feature sizes get smaller, the smaller geometries result in higher electrical resistances, which in turn degrade circuit performance. As will be described more fully later, damascene process provides a more exact dimensional control over small geometries, while copper, as the metallization material, provides better electrical characteristics.

The term 'damascene' is derived from a form of inlaid metal jewelry first seen in the city of Damascus. In the context of integrated circuits it implies a patterned layer imbedded on and in another layer such that the top surfaces of the two layers are coplanar. Thus, in semiconductor manufacturing, grooves and holes in appropriate locations in the grooves are formed in an insulating material by etching, which are then filled with metal. Metal in grooves form the horizontal metal line interconnects while the metal in the underlying holes form the vertical connections to the layers of metal interconnects formed in the previous damascene structure.

Thus, in a single damascene semiconductor manufacturing process, incisions, or grooves, are formed in an insulating layer and filled with metal to form conductive lines. Dual damascene takes the process one step further in that, in addition to forming the grooves of a single damascene, hole openings are also formed at appropriate places in the groove further into the insulating layer. The resulting composite structure of grooves and holes are filled with metal. The process is repeated as many times as required to form the multi-level interconnections between metal lines and the holes formed therebetween.

In one approach for a dual damascene process shown in FIG. 1a, two insulating layers (120) and (130) are formed on a substrate (100) with an intervening etch-stop layer (125). Substrate (100) is provided with metal layer (110) and a barrier layer (115). Metal layer can be the commonly used aluminum or copper, while the barrier can be an oxide layer. A desired trench or groove pattern (150) is first etched into the upper insulating material (130) using conventional photolithographic methods and photoresist (140). The etching stops on etch-stop layer (125). Next, a second photoresist layer (160) is formed over the substrate, thus filling the groove opening (150), and patterned with hole opening (170), as shown in FIG. 1b. The hole pattern is then etched into the lower insulating layer (120) as shown in FIG. 1c and photoresist removed, thus forming the dual damascene structure shown in FIG. 1f.

Or, the order in which the groove and the hole are formed can be reversed. Thus, the upper insulating layer (130) is first etched, or patterned, with hole (170), as shown in FIG. 1d. The hole pattern is also formed into etch-stop layer (125). Then, the upper layer is etched to form groove (150) while at the same time the etching transfers the hole pattern in the etch-stop layer into lower insulation layer (120), as shown in FIG. 1e. It will be noted that the etch-stop layer stops the etching of the groove into the lower insulation layer. After the completion of the thusly formed dual damascene structure, both the hole opening and groove opening are filled with metal (180), and any excess material on the surface of the substrate is removed by chemical mechanical polishing, as seen in FIG. 1f.

In prior art, there are various dual damascene processes that are taught. Huang, et al., in U.S. Pat. No. 5,635,423, disclose a simplified dual damascene process for multi-level metallization and interconnection structure. In one embodiment, an opening for a via is initially formed in a second insulative layer above a first insulative layer with an etch-stop layer therebetween. A larger opening for a trench is then formed in the second insulative layer while simultaneously extending the via opening through the etch-stop layer and first insulative layer. The trench and via are then simultaneously filled with conductive material.

Yu, et al., propose, in U.S. Pat. No. 5,985,753, a method to manufacture dual damascene using a phantom implant mask, wherein a selected layer is implanted with heavy ions in a pattern having dimensions of a via structure to be formed in a first layer of interlayer dielectric. In a first embodiment, the ions are implanted in an etch-stop layer formed between a first and second layer of interlayer dielectric. In a second embodiment, the ions are implanted in the second layer of interlayer dielectric. Selective etch processes form a trench structure in the second layer of interlayer dielectric and form a via structure in the first layer of interlayer dielectric. The via structure and trench structure are filled with a conductive material.

In another U.S. Pat. No. 6,013,581, Wu, et al., show a method for preventing the occurrence of poisoned trenches and vias in a dual damascene process that includes performing a densification process, such as a plasma treatment, on the surface of the exposed dielectric layer around the openings before the openings are filled with conductive material. The densified surface of the dielectric layer is able to prevent the occurrence of poisoned trenches and vias caused by the outgassing phenomenon.

Liu, et al., of U.S. Pat. No. 6,010,962, on the other hand, teach a method of forming inlaid copper interconnects, but without the attendant dishing that occurs after chemical-mechanical polishing (CMP) of excess copper. This is accomplished by forming a conformal blanket barrier layer in the form of a dome-like structure over the interconnect so that this structure prevents the dishing of the copper metal during CMP.

The present invention teaches the use of different composition of materials for forming a dual damascene structure having an over-all low dielectric constant and reduced RC delay characteristics.

SUMMARY OF THE INVENTION

It is therefore an object of the present invention to provide a method of utilizing a novel intermetal dielectric (IMD) composition and an organic etch-stop layer in forming a dual damascene structure.

It is another object of the present invention to provide a method of forming a dual damascene interconnect having a low RC delay and low dielectric constant.

It is still another object of the present invention to provide a dual damascene structure having a different IMD layer and an organic etch-stop layer with the attendant advantages of having an damascene interconnect with low RC delay and low dielectric constant.

These objects are accomplished by providing a semiconductor substrate having a substructure comprising devices formed therein, and metal layers and insulative layers formed thereon; forming a passivation layer over said substrate; forming a first intermetal dielectric (IMD) layer over said passivation layer; forming an organic etch-stop layer over said first IMD layer; forming a second IMD layer over said etch-stop layer; forming a first photoresist layer over said second IMD layer and patterning said photoresist layer with a mask comprising a via hole pattern; etching through said via pattern in said first photoresist layer to form said via hole in said second IMD layer until said organic etch-stop layer is reached; etching through said via hole pattern to form said via hole in said organic etch-stop layer; etching further said via hole pattern into said first IMD layer until said passivation layer is reached; removing said first photoresist layer; forming a second photoresist layer over said second IMD layer including said via hole in said second IMD layer; patterning said second photoresist layer with a mask comprising a line trench pattern; etching through said line trench pattern in said second photoresist layer into said second IMD layer; etching further through said line trench pattern into said organic etch-stop layer and extending said hole pattern into said passivation layer thus forming a dual damascene structure comprising a composite hole and line trench pattern in said substrate; removing said second photoresist layer; and depositing metal into said composite hole and line pattern and removing excess metal to complete the forming of the dual damascene of the present invention.

These objects are further accomplished by providing a semiconductor substrate having a substructure comprising devices, metal layers and insulative layers formed thereon; a passivation layer formed over said substrate; a first FSG layer formed over said passivation layer; an organic etch-stop layer over said first FSG layer; a second FSG (Fluorinated Silicate Glass) layer over said organic etch-stop layer; a dual damascene structure comprising a composite hole pattern and a line trench pattern formed in said first and second FSG layers, respectively; and metal in said structure completing the dual damascene interconnect of the present invention.

BRIEF DESCRIPTION OF THE DRAWINGS

FIGS. 1a–1c show the forming of a dual damascene structure where a line trench or groove is etched first into an upper second dielectric layer until an etch-stop layer is reached, and then the hole pattern etched into the lower first dielectric layer, according to prior art.

FIGS. 1d–1e show the forming of a dual damascene structure where a hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene structure formed by either one of the methods shown in FIGS. 1a–1c or FIGS. 1d–1e, according to prior art.

FIG. 2a is a partial cross-sectional view of a substrate showing the forming of a first and a second intermetal dielectric (IMD) layer separated from each other by an intervening organic etch-stop layer while being separated from the substrate by a passivation layer, according to the present invention.

FIG. 2b is a partial cross-sectional view of a substrate showing the patterning of a photoresist layer with a hole pattern over the substrate of FIG. 2a, according to the present invention.

DESCRIPTION OF THE PREFERRED EMBODIMENTS

Figure 2C:
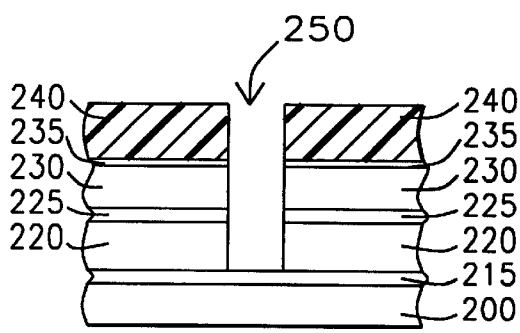
FIG. 2c is a partial cross-sectional view of a substrate showing the etching of the hole pattern of FIG. 2b into the second and first IMD layers, according to the present invention.

Referring now the drawings, in particular to FIGS. 2a–2f, there is shown a dual damascene process utilizing an intermetal dielectric (IMD) layer and an organic etch-stop layer in order to provide a dual damascene interconnect having low a resistance-capacitance (RC) delay and an overall low dielectric constant.

Specifically, FIG. 2a shows a portion of a semiconductor substrate (200), preferably silicon, provided with a substructure of devices formed in the substrate and/or metal layers thereof, and as they are not significant to the invention, they are not described in detail in order not to unnecessarily obscure the present invention.

A passivation layer, layer (215) in FIG. 2a, is formed over the underlying substructure of substrate having metal layers (not shown). Preferably the passivation layer is silicon nitride (SiN) formed by reacting dichlorosilane ($SiCl_2H_2$), or silane ($SiH_4$), with ammonia ($NH_3$) in an LPCVD at a pressure between about 0.05 to 1. torr, temperature between about 600 to 900° C. and at flow rates between about 10 to 200 standard cubic centimeters per minute (sccm), and to a thickness between about 100 to 500 Å.

Next, an intermetal dielectric (IMD) layer is formed over the passivation layer. The dielectric layer is referred as intermetal dielectric because of its position between metal layers in the substrate. As is well known in the art, blanket dielectric layers may be formed from materials including but not limited to silicon oxide materials, silicon nitride materials, and silicon oxynitrides materials formed within integrated circuits through methods including but not limited do CVD, PECVD, PVD sputtering methods. The blanket dielectric layer can be a borophosphosilicate glass (PSG) or a borophosphorous oxide (BPTEOS) formed by the decomposition of tetraethyl orthosilicate (TEOS) using plasma enhanced chemical vapor deposition (PECVD).

However, as a main feature and key aspect of the present invention, first IMD layer (220) formed over the passivation layer is a fluorinated silicate glass (FSG). The FSG with the formula SiOF is formed by reacting $SiH_4+N_2O+CF_4$, and preferably to a thickness between about 3000 to 8000 Å. The use of FSG as an IMD is disclosed here because of its properties to yield low resistance-capacitance (RC) delay. Also, it is simpler to use FSG as the IMD material in place of complicated design changes that would be required to reduce the relatively high RC values of conventional damascene interconnects obtained with conventional dielectric materials. Silicon nitride can also be used as a dielectric material in order to improve the RC characteristics of the interconnect. However, silicon nitride is known to have a large dielectric constant (k). As is known in the art, low-k materials are sought in forming damascene interconnects, especially with copper damascenes in order to improve the electrical characteristics further.

Thus, to reduce the overall dielectric constant of the dual damascene composite structure to be formed, another key aspect of the present invention is the disclosure of the use of a low-k, organic etch-stop player (225), as the next layer to be formed over layer (220) as shown in FIG. 2b. The disclosed organic etch-stop layer is spin-on-glass (SOG) and is formed by spin coating. It is preferred that the organic SOG (O-SOG) has a high selectivity ratio between about 30 to 40 with respect to the IMD layer so that patterned etching in the subsequent steps can be performed relatively easily. It is also preferred that the thickness of the O-SOG is between about 200 to 1000 Å.

A second IMD layer, layer (230) in FIG. 2a, is next formed over the O-SOG layer. Second IMD layer is also a fluorinated silicate glass, and has a thickness between about 3000 to 8000 Å. It is preferred that an antireflective coating (ARC) is also formed over the second IMD layer, to a thickness between about 100 to 1000 Å. This is because, ARC layer (235) shown in FIG. 2a then serves to control the dimensional integrity (CD control, as is known in the art) during a subsequent etch step.

A first photoresist layer is next formed and patterned with a hole opening using conventional methods, as shown in FIG. 2b. Hole pattern (250) is then etched into the second and first IMD layers, in that order, including the intervening O-SOG layer (225) as shown in FIG. 2c. The etching of the intermetal dielectric layers, including layers (230), (225) and (220), is accomplished with a recipe comprising $C_4F_8/N_2/Ar/CO$ (Fluorocarbon/Nitrogen/Argon/CarbonOxide). It is important that the gas ratio of $N_2/C_4F_8$ for the IMD and O-SOG etching are about between about 0 to 10.

Figure 2D:
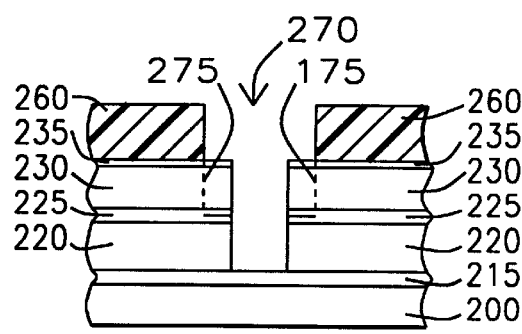
FIG. 2d is a partial cross-sectional view of a substrate showing the patterning of a photoresist layer with a line pattern over the substrate of FIG. 2c, according to the present invention.
Figure 2E:
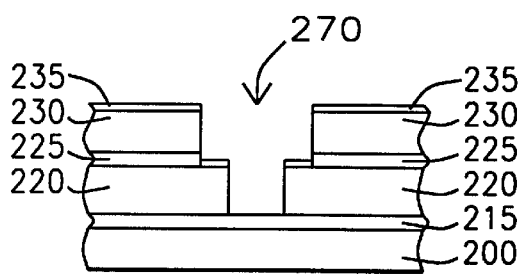
FIG. 2e is a partial cross-sectional view of a substrate showing the etching of the line pattern in the second IMD layer into the organic etch-stop layer of FIG. 2d, while at the same time etching the hole pattern in the first IMD layer into the passivation layer, according to the present invention.

Next, the first photoresist layer is removed, preferably by oxygen plasma ashing, and a second photoresist layer (260) formed over the substrate, including the opening formed in the previous step, and patterned with the image of a line trench to form groove (270) as shown in FIG. 2d. The line pattern is next transferred from the second photoresist layer into the second IMD layer by using an etch recipe comprising $C_4F_8/Ar/CO$, and first stopping on O-SOG etch-stop layer (225) as shown by phantom lines (275). After removal of the second photoresist layer, the same line pattern is then transferred from the second IMD layer into the O-SOG etch-stop layer (225), while at the same time transferring the hole pattern already in the first IMD layer into passivation layer (215), as shown in FIG. 2e. This is accomplished with an etch recipe $C_4F_8/Ar/CO$. having high selectivity with respect to the dielectric layers.

Figure 2F:
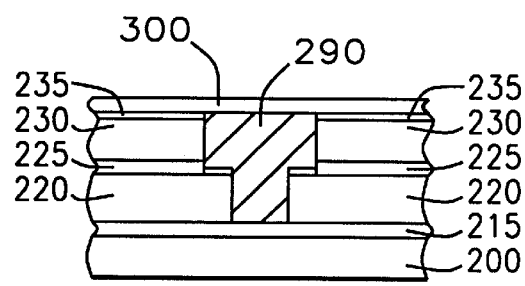
FIG. 2f is a partial cross-sectional view of a substrate showing the deposition of metal into the composite line and hole structure of FIG. 2e to complete the forming of the dual damascene interconnect of this invention.

As a penultimate step, the composite line/hole structure shown in FIG. 2e can be lined with a material which forms a good barrier to copper diffusion (not shown). Next, the composite structure is preferably filled with copper (290) and the excess metal is removed by chemical mechanical polishing, which is commonly used for planarizing surfaces. Metal layer (290) can also be an aluminum-copper alloy. Finally, the copper damascene structure of the invention is completed by forming still another passivation layer (300) to serve as a top barrier lid for the copper interconnect, or as an etch-stop layer for the next level of metallization as shown in FIG. 2f.

It will be apparent to those skilled in the art that, the etch-stop layers, namely the disclosed organic SOG layers become integrated into the disclosed copper damascene interconnect, and hence contribute to an over-all smaller effective dielectric constant than would otherwise be. In addition to having a lower dielectric constant than, for example, the commonly used PECVD silicon nitride, organic SOG also has good qualities as a barrier to copper diffusion. Thus, O-SOG can also serve as barrier layer on the vertical sidewalls of the copper damascene interconnect shown in FIG. 2f. Though numerous details of the disclosed method are set forth here, such as these processes and process parameters, to provide an understanding of the present invention, it will be obvious, however, to those skilled in the art that these specific details need not be employed to practice the present invention. At the same time, it will be evident that the same methods may be employed in other similar process steps that are too many to cite, such as the forming of etch-stop layers as well as barrier layers comprising the disclosed organic spin-on-glass. For that matter, the FSG can be replaced with inorganic low-k materials, or silicon oxide, as an example.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of using a novel inter-metal dielectric tric (IMD) film composition in a dual damascene process comprising the steps of:

providing a semiconductor substrate having a substructure comprising devices formed therein, and metal layers and insulative layers formed thereon;

forming a passivation layer over said substrate;

forming a first fluorinated silicate glass (FSG) layer by reacting SiH4+N2O+CF4 over said passivation layer;

forming an organic etch-stop layer over said first FSG layer;

forming a second FSG layer, followed by an antireflective coating (ARC) layer over said organic etch-stop layer;

forming a dual damascene structure comprising a composite hole pattern and a line trench pattern in said first and second FSG layers, respectively; and depositing metal in said structure and removing excess metal to complete the forming of the dual damascene of the present invention.

2. The method of claim 1, wherein said passivation layer comprises silicon nitride (SiN).

3. The method of claim 1, wherein said passivation layer has a thickness between about 100 to 500 Å.

4. The method of claim 1, wherein said fist FSG has a thickness between about 3000 to 8000 Å.

5. The method of claim 1, wherein said organic etch-stop layer comprises organic spin-on-glass (O-SOG).

6. The method of claim 1, wherein said organic etch-stop layer has a thickness between about 200 to 1000 Å.

7. The method of claim 1, wherein said second FSG has a thickness between about 3000 to 8000 Å.

8. The method of claim 1, wherein said metal is copper or aluminum-copper alloy.

9. A method of using a novel inter-metal dielectric (IMD) film composition in a dual damascene process comprising the steps of:

providing a semiconductor substrate having a substructure comprising devices formed therein, and metal layers and insulative layers formed thereon;

forming a passivation layer over said substrate;

forming a first intermetal dielectric (IMD) layer over said passivation layer, wherein said IMD comprises fluorinated silicate glass (FSG) obtained by reacting $SiH_4 + N_2O + CF_4$;

forming an organic etch-stop layer over said first IMD layer;

forming a second IMD layer over said etch-stop layer, wherein said IMD comprises FSG obtained by reacting $SiH_4 + N_2O + CF_4$;

forming an ARC layer over said second IMD layer;

forming a first photoresist layer over said second IMD layer and patterning said photoresist layer with a mask comprising a via hole pattern;

etching through said via pattern in said first photoresist layer to form said via hole in said second IMD layer until said organic etch-stop layer is reached;

etching through said via hole pattern to form said via hole in said organic etch-stop layer;

etching further said via hole pattern into said first IMD layer until said passivation layer is reached;

removing said first photoresist layer;

forming a second photoresist layer over said second IMD layer including said via hole in said second IMD layer;

patterning said second photoresist layer with a mask comprising a line trench pattern;

etching through said line trench pattern in said second photoresist layer into said second IMD layer;

etching further through said line trench pattern into said organic etch-stop layer and extending said hole pattern into said passivation layer thus forming a dual damascene structure comprising a composite hole and line trench pattern in said substrate;

removing said second photoresist layer; and depositing metal into said composite hole and line pattern and removing excess metal to complete the forming of the dual damascene of the present invention.

10. The method of claim 9, wherein said passivation layer is silicon nitride (SiN) formed by reacting $SiH_4$ with $NH_3$.

11. The method of claim 9, wherein said passivation layer has a thickness between about 100 to 500 Å.

12. The method of claim 9, wherein said first IMD layer has a thickness between about 3000 to 8000 Å.

13. The method of claim 9, wherein said organic etch-stop layer comprises an organic spin-on-glass (SOG).

14. The method of claim 9, wherein said organic etch-stop layer has a thickness between about 200 to 1000 Å.

15. The method of claim 9, wherein said etching to form said via hole in said second IMD layer is accomplished with a recipe comprising $C_4F_8/N_2/Ar/CO$ (fluorocarbon/nitrogen/argon/carbonoxide).

16. The method of claim 9, wherein said etching to form said via hole in said second IMb layer is accomplished with a recipe comprising $C_4F_8/N_2/Ar/CO$.

17. The method of claim 9, wherein said etching to form said via hole in said organic etch-stop layer is accomplished with a recipe comprising $C_4F_8/N_2/Ar/CO$.

18. The method of claim 9, wherein said etching further said via hole pattern into said first IMD layer is accomplished with a recipe comprising $C_4F_8/N_2/Ar/CO$.

19. The method of claim 9, wherein said etching said line trench pattern into said second IMD layer is accomplished with a recipe comprising $C_4F_8/Ar/CO$.

20. The method of claim 1, wherein said etching further through said line trench pattern into said organic etch-stop layer and extending said hole pattern into said passivation layer is accomplished with a recipe comprising $C_4F_8/Ar/CO$.

21. The method of claim 1, wherein said metal is copper having a thickness between about 1000 to 8000 Å.

* * * * *